United States Patent [19]
Maniar

[11] Patent Number: 5,910,680
[45] Date of Patent: Jun. 8, 1999

[54] GERMANIUM SILICATE SPIN ON GLASS SEMICONDUCTOR DEVICE AND METHODS OF SPIN ON GLASS SYNTHESIS AND USE

[75] Inventor: Papu D. Maniar, Austin, Tex.

[73] Assignee: Motorola, Inc., Schaumburg, Ill.

[21] Appl. No.: 08/215,170

[22] Filed: Mar. 21, 1994

Related U.S. Application Data

[63] Continuation of application No. 07/807,327, Dec. 16, 1991, abandoned.

[51] Int. Cl.$^6$ ................................................ H01L 23/58
[52] U.S. Cl. ................................ 257/650; 257/644
[58] Field of Search ............................ 257/760, 644, 257/641, 650; 428/428; 438/778, 780

[56] References Cited

U.S. PATENT DOCUMENTS

| | | |
|---|---|---|
| 4,477,580 | 10/1984 | Fleming, Jr. .................. 65/17 |
| 4,654,269 | 3/1987 | Lehrer ....................... 257/644 |
| 4,935,095 | 6/1990 | Lehrer ....................... 257/760 |
| 5,114,738 | 5/1992 | Savage et al. ................ 65/3.11 |

*Primary Examiner*—Mahshid Saadat
*Assistant Examiner*—S. V. Clark
*Attorney, Agent, or Firm*—Keith E. Witek

[57] ABSTRACT

A semiconductor device (11) has a spin on glass layer or region, and the spin on glass has a method of synthesis and use. The spin on glass composition is formed which comprises on the order of 0% to 20% by volume of tetraethylorthosilicate (TEOS), on the order of 0.01% to 20% by volume of tetraethylorthogermanate (TEOG), on the order of 0% to 1% by volume the equivalent of nitric acid ($HNO_3$), on the order of 70% to 85% by volume of alcohol, and a remaining balance of the spin on glass composition being water. The spin on glass is applied to a semiconductor substrate and heated and/or densified to form the spin on glass layer or region.

20 Claims, 2 Drawing Sheets

GERMANIUM SILICATE SPIN ON GLASS SEMICONDUCTOR DEVICE AND METHODS OF SPIN ON GLASS SYNTHESIS AND USE

This application is a continuation of prior application Ser. No. 07/807,327, filed Dec. 16, 1991, abandoned.

FIELD OF THE INVENTION

The present invention relates generally to semiconductor technology, and more particularly, to spin on glasses.

BACKGROUND OF THE INVENTION

Spin on glasses (SOGs) are known materials used in the fabrication of semiconductor devices. SOGs are primarily used to planarize a semiconductor wafer, but are also used as inter-layer dielectrics, passivation layers, plug regions, and sacrificial etch-back layers. As the name "spin on glasses" suggests, SOGs are deposited onto a semiconductor substrate and the substrate is spun at high speeds to distribute the SOG uniformly across the substrate surface. SOGs are initially in a liquid state, which allows the SOG to fill any open spaces, contacts, crevices, or voids which might be on a substrate surface. The coated substrate is then baked to remove residual water and solvents and to densify the SOG into a solid, glass-like film.

Conventional SOGs can be classified into two general categories, silicate SOGs and siloxane SOGs. Silicate SOGs are polymer networks containing primarily Si—O bonds. Silicate SOGs have an advantage of forming highly pure silicon dioxide ($SiO_2$) films, without organic contaminants. A disadvantage associated with conventional $SiO_2$ SOGs is that upon baking, the films shrink considerably, creating high stresses in the films and in an underlying substrate. Another disadvantage is that $SiO_2$ SOGs do not planarize uniformly or sufficiently. For example, a silicate SOG may planarize a small space between two structures, but as the size of the space increases the planarization capability is reduced. In general, $SiO_2$ SOGs reduced topography when compared to chemical vapor deposited (CVD) conformal films, but also created undesirable mechanical stress and strain in integrated circuits.

In addition, $SiO_2$, due to mechanical and chemical properties, could not fill very narrow trenches or contacts. When CVD $SiO_2$ is used to form plugs in narrow trenches or trenches with a high aspect ratio, a known and undesirable phenomenon called crevice formation occurs. The compatibility of materials with narrow trenches or contacts is important because narrow trenches and contacts are becoming widely used as integrated circuit cell sizes decrease and photolithographic minimum geometry sizes shrink. Another disadvantage related to the use of $SiO_2$ is that $SiO_2$ formations and layers cannot be planarized via conventional reflow techniques and therefore are less planar than currently desired.

In an effort to improve planarization capabilities of SOGs, semiconductor manufacturers have used several techniques. One technique used is to apply a very thick SOG film due to the fact that thick SOG films can be made more planar than thin SOG films. However, very thick SOG films have a greater tendency to crack, particularly upon baking. Another technique is to apply multiple, thin SOG films to improve planarity without experiencing cracking problems. While several thin films can improve planarity with greater resistance to cracking, using multiple films significantly increases manufacturing time. Another way to improve planarization capability of a SOG is to add dopants, such as boron or phosphorus, to the film. These dopants aid in the reflow of the SOG during subsequent anneal, and improve the planarity of the SOG layer. However, there are applications in semiconductor devices in which doping an SOG is not appropriate, and the doped SOGs still results in stress and strain above desired levels.

SUMMARY OF THE INVENTION

The previously mentioned disadvantages are overcome and other advantages achieved with the present invention. In one form, the present invention comprises a semiconductor device. The semiconductor device has a substrate and a plurality of device layers. A spin on glass composition forms a layer of the semiconductor device. The spin on glass composition comprises on the order of 0% to 20% by volume of tetraethylorthosilicate (TEOS); on the order of 0.01% to 20% by volume of tetraethylorthogermanate (TEOG); on the order of 0% to 1% by volume the equivalent of nitric acid ($HNO_3$); on the order of 70% to 85% by volume of alcohol; and a remaining balance of the spin on glass composition of water. In another form, the present invention comprises a method of use and a method of synthesis of the spin on glass.

The present invention will be understood by one skilled in the art from the detailed description below in conjunction with the accompanying drawings.

DESCRIPTION OF THE PREFERRED EMBODIMENT

Spin-on-glasses (SOGs) are commonly used in semiconductor device fabrication as planarization, passivation, plug regions, or inter-layer dielectric layers. Although the use of SOGs is relatively widespread, there are several disadvantages with commercially available SOGs. Conventional silicate SOGs, for example, do not planarize sufficiently and create large stresses in a semiconducting substrate due to a high degree of shrinkage. The more widely used siloxane SOGs have improved step coverage and reduced stress, but have a disadvantage of containing organics which can affect performance and reliability of a semiconductor device. In addition, siloxane SOGs decompose easily and have a tendency to absorb water. The use of doped materials, such as boro-phosphate-silicate-glass (BPSG), to form planar layers and plug regions also has disadvantages. BPSG results in boron, phosphorus, or like doping impurity penetration that can alter adjacent device performance or render adjacent devices inoperable. BPSG doped materials can also produce stress that is above desired levels. The present invention overcomes these problems by using a TEOG/TEOS based SOG containing tetraethylorthogermanate (TEOG), tetraethylorthosilicate (TEOS), nitric acid ($HNO_3$), isopropyl alcohol (IPA), and water (usually de-ionized $H_2O$) in a specified range of concentrations.

Figure 1:
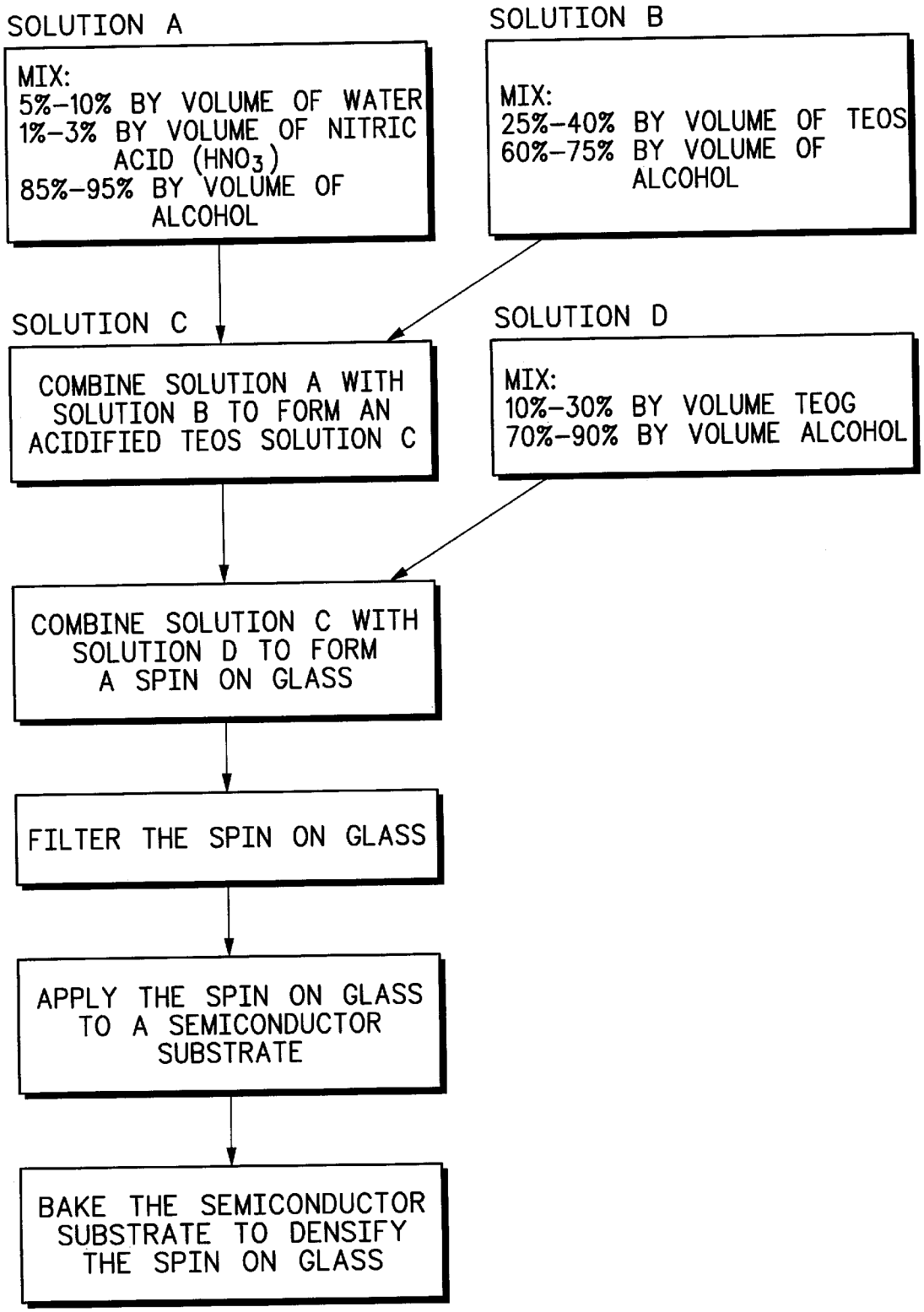
FIG. 1 illustrates, in flow chart form, a method of forming and using a spin on glass in accordance with the present invention.

Illustrated in FIG. 1 is a flow chart of a method used to create a TEOG/TEOS based spin on glass. A solution A is formed by mixing together 5%–10% by volume of water, 1%–3% by volume of nitric acid, and 85%–95% by volume of alcohol. The order in which the mix occurs is not overly critical, although the nitric acid and water are usually mixed together followed by the addition of the alcohol. The type of alcohol usually used for mixtures described herein is isopropyl alcohol (IPA), and the nitric acid used for mixtures described herein is usually 70% nitric acid. A solution B is formed by mixing together 25%–40% by volume of tetraethylorthosilicate (TEOS) and 60% to 70% by volume of alcohol. Solution A is usually referred to as a dilute nitric acid solution, and solution B is usually referred to as a dilute TEOS solution.

Once solutions A and B are formed, a solution C can be formed by mixing solutions A and B together in various quantities. Usually solution A is mixed into solution B to prevent excessive polymerization or precipitation of TEOS due to the presence of water in solution A. Solution C is formed by mixing together 35%–50% by volume of solution A and 50%–65% by volume of solution B. Solution C therefore contains approximately 72%–81% by volume alcohol, 2%–4% by volume water, 0.4%–1.3% by volume nitric acid, and 14%–23% by volume TEOS. Solution C is usually referred to as an acidified TEOS solution. Solution C is a stable SOG of $SiO_2$ and can be spin coated independent of any dopants, if so desired.

A solution D is formed by mixing together 10%–30% by volume of tetraethylorthogermanate (TEOG) and 70%–90% by volume of alcohol. In most cases the alcohol used for solution D is isopropyl alcohol. Solution D is usually referred to as a dilute TEOG solution.

The solution D and the solution C are mixed together to form a TEOS/TEOG based spin on glass solution. Usually solution D is mixed into solution C. By doping the solution C with solution D, several advantagous properties of the solution C SOG are preserved in the mixture. Several advantageous properties are for example, shrinkage of SOG layers are minimized, planarization of SOG layers are improved, and SOG solution stability is improved.

Solutions C and D are mixed together in almost any ratio that ranges from 105:1 to 1:105 by volume. The concentration depends largely on stress reduction considerations. It is possible to alter the stress properties and reflow temperature of the spin on glass by altering its relative concentrations of TEOG and TEOS. By varying these compounds in the spin on glass, a spin on glass can be formed with minimum stress for nearly any type of substrate material and/or application. Therefore, a minimum-stress custom-designed TEOG/TEOS spin on glass can be made for various substrates and layers such as gallium-arsenide, epitaxial silicon, polysilicon, silicon, germanium, dielectrics, metals, and the like. Minimum-stress custom-designed TEOG/TEOS spin on glasses can also be made for many different applications, such as planarization, plug technology, passivation, inter-level dielectrics, trench isolation, and the like. The stress altering flexibility of TEOG/TEOS based spin on glass is a great advantage over conventional spin on glass technology.

To be more specific, solutions C and D are mixed to form a spin on glass that is made up of 70% to 85% by volume alcohol or IPA, 0% to 3.5% by volume water (usually de-ionized water), 0% to 1% by volume nitric acid, 0%–20% by volume TEOS, and 0%–20% by volume TEOG by volume. A preferred composition for use with a silicon substrate is on the order of 10% by volume TEOS, 10% by volume TEOG, 0.5% by volume nitric acid, 78% by volume alcohol, 1.5% by volume water. The preferred composition defined above uses de-ionized water, isopropyl alcohol (IPA), and a nitric acid compound known as 70% nitric acid for most applications.

After the chemical synthesis of the spin on glass, a filtering step is performed on the spin on glass as illustrated in FIG. 1. The filtering step for most spin on glasses involves flowing the spin on glass through a physical or mechanical material or apparatus that filters particles and contaminants out of the spin on glass. Many chemical, magnetic, and electrical cleaning and filtering methods exist in integrated circuit processing. These chemical, magnetic, and electrical cleaning and filtering methods can be used for spin on glass filtering although the practice of chemically, magnetically, or electrically filtering a spin on glass is not widely accepted, useful, or used.

Once the TEOG/TEOS spin on glass (SOG), described above, has been formed, the spin on glass (SOG) can then be applied to a silicon substrate wafer. In order to apply an SOG to a silicon substrate, the silicon substrate is usually held securely on a flat, horizontally-positioned device that is capable of being rotated. Once the silicon substrate is secured by vacuum to the horizontally-positioned device the SOG is deposited on the silicon substrate wafer and the wafer is rotated to uniformly spread the SOG to coat or overlie the substrate material. Rotation of the wafer can also start before application of the SOG. A typical speed that is used to apply SOGs to semiconductor surfaces is 3000 RPM (rotations per minute) although wide ranges from 1000 RPM to 6000 RPM and beyond are possible. Some applications of SOG may require complex ramp up, ramp down, varying speed, or oscillating rotational behavior to be applied appropriately. Various cleaning steps such as the application of de-ionized (DI) water, solvents or other chemicals could be used as a pre-cleaning step for SOG application. A cleaning step can also be used to promote adhesion as is done for conventional photoresist applications. It is important to note that other methods of application are possible.

Once the substrate has been coated with the TEOG/TEOS spin on glass, a heating step or multiple heating steps are used to densify the spin on glass and to drive impurities, contamination, water and other potentially circuit-harmful compounds out of the spin on glass.

Most SOGs that are spin deposited and heated give optimal results and have certain advantages when formed at a certain thickness. This certain thickness is in some cases not thick enough to be useful in applications such as planarization. In order to achieve thicker SOG layers for use in other applications, the previously discussed method of spin deposition and substrate baking can be performed successively to form thicker layers. For example, assume that planarization layer must be 7000 angstroms thick, and assume that a spin on glass can be applied for a thickness of 1800 angstroms per spin deposition. The spin on glass must then be applied roughly four times in succession to achieve a dielectric thickness of roughly 7000 angstroms. There are of course many physical, chemical, mechanical, and electrical properties that affect the average thickness of successive SOG layers. Therefore, the application of multiple SOG layers may not always linearly increase the overall SOG layer thickness.

Via experimentation, it has been found that the inventive TEOG/TEOS spin on glass described herein has overcome some of the previously mentioned disadvantages of conventional spin on glass technology. In addition, the inventive TEOG/TEOS spin on glass has several added advantages over conventional spin on glass technology if processed properly. The overcome disadvantages and possible added advantages are as follows: (1) reduced integrated circuit stress levels and reduced spin on glass film cracking for all applications; (2) annealed/post-heated spin on glass films have no signs of organic impurities or hydroxyls and no water absorption occurs; (3) virtually no spin on glass film decomposition as a function of time or as a function of atmospheric exposure when heat treated properly; (4) no damaging doping impurity penetration due to a minimal amount of mobile impurities in the SOG; (5) variable stress levels can be achieved simply by varying the TEOG composition (this allows the spin on glass to adapt to many substrate types, layer types and applications); (6) a low SOG film shrinkage percentage that helps to further reduce stress; (7) more planar coverage than conventional silicate spin on glasses; (8) Auger Depth Profiles show no preferential loss of germanium in the spin on glass which means that the germanium in the spin on glass remains uniform throughout subsequent processing; (9) reduced SOG layer peeling; (10) increased adhesion between successive coats of the inventive SOG layer; and/or (11) reflow temperatures can be altered by varying the TEOG composition of the SOG.

Figure 2:
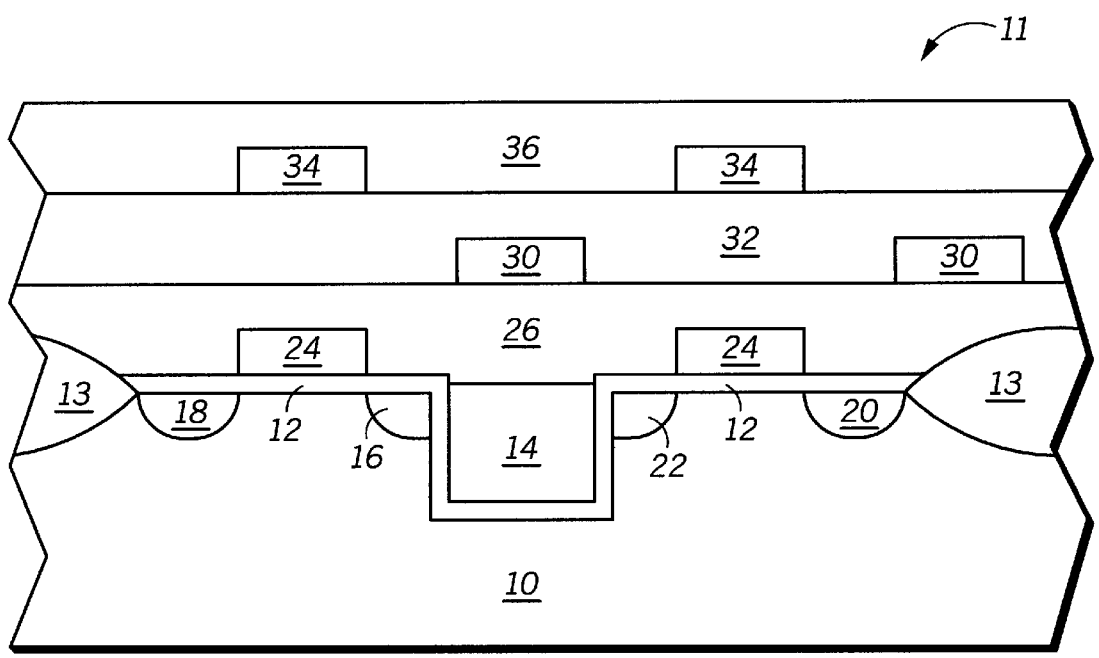
FIG. 2 illustrates, in cross-sectional form, a semiconductor device in accordance with the present invention.

The advantages discussed above can be used in many integrated circuit device applications. FIG. 2 illustrates a semiconductor device 11. Device 11 is used to illustrate many semiconductor device uses of a TEOG/TEOS spin on glass. It is important to note that the applications and uses illustrated in FIG. 2 can be applied to any conventional semiconductor device or circuit.

Device 11 has a substrate 10 and a plurality of diffused regions 16, 18, 20, and 22. Device 11 also has a gate layer 12 and a field dielectric 13. A gate region 24 is illustrated, and layers 30 and 34 are overlying conductive layers that can be made of metal, polysilicon, or the like. Three planar layers 26, 32 and 36 are illustrated, and a plug region 14 separates diffused region 16 from diffused region 22. Device 11 has a minimal amount of device layers and complexity in order to simplify the illustration of the many uses of the spin on glass described herein. It is important to note that many other layers of dielectric materials, conductive layers, semi-conductive layers and the like can be added to FIG. 2 and not depart from the scope of this invention. All of the layers and regions of device 11 discussed above are referred to as a plurality of device layers.

One application of the TEOG/TEOS spin on glass described herein is for use as a plug region or trench isolation structure. If plug region 14 is made of the TEOG/TEOS spin on glass, plug region 14 would illustrate the plug region or trench isolation structure use. Planarization layers such as planar layer 26 can be formed with the TEOG/TEOS spin on glass. Gate-level dielectric layers, such as planar layer 26, can be formed using the TEOG/TEOS spin on glass described herein. Planarization layers, such as planar layer 32 can be formed. Passivation layers or protective layers, such as planar layer 36, can be formed using the TEOG/TEOS spin on glass. These applications will gain some or all of the various advantages discussed herein through the use of the TEOG/TEOS spin on glass. Spin on glasses can also be used as sacrificial etch back layers (not illustrated). Sacrificial etch back layers are difficult to represent in a single figure due to the fact that they are sacrificial and involve illustrating a process flow.

The applications described above do not have to all be used in the same circuit, process, or device. The applications described above, such as planarization, plug regions, trench isolation, passivation, sacrificial etch back layers, inter-level dielectric layers, and the like are all independent, and can be used apart from one another in different devices, processes, and circuits. It should be understood that device 11 is used to illustrate as many of the applications as possible using one concise figure.

The final SOG taught herein comprises 70%–85% by volume of alcohol, 0% to 3.5% by volume water, 0% to 20% by volume TEOS, 0% to 20% by volume TEOG, and 0% to 1.0% by volume nitric acid. Given these ranges, the ratio of volume of water to the sum of volume of TEOS and TEOG theoretically ranges from 0 to $\infty$ and may be less than 0.80. In one form, the ratio of volume of water to the sum of volume of TEOS and TEOG may be set to a value substantially equal to 0.08 given the above-listed ranges. Using simple division on the above ranges illustrates that an SOG having a ratio of volume of nitric acid to volume of water which is greater than 0.05 can be made. Using simple division on the above ranges illustrates that an SOG having a ratio of volume of nitric acid to volume of water which is substantially equal to 1.0 can be formed. Using simple division on the above ranges illustrates that an SOG having a ratio of volume of alcohol to the sum of volume of TEOS and TEOG less than 15.0 can be formed. Using simple division on the above ranges illustrates that an SOG having a ratio of volume of isopropyl alcohol to the sum of volume of TEOS and TEOG which is substantially equal to 3.7 can be formed. Also, an SOG may be formed wherein the volume of alcohol to the sum of volume of TEOS and TEOG is between 20.0 and 1.75 using the above listed ranges. Using simple division, many other ratios of volumes may be derived given the ranges disclosed herein.

While the present invention has been illustrated and described with reference to specific embodiments, further modifications and improvements will occur to those skilled in the art. For example, various methods of applying the inventive spin on glass can be used. The inventive SOG can be used in applications that have substrates or materials made of doped silicon, epitaxial formations, gallium-arsenide, germanium silicon, germanium, sapphire, and the like. In addition, many applications for spin on glass technology continue to appear, and this spin on glass may satisfy these new applications and new application needs. Other acids may be able to take the place of nitric acid but still serve the same purpose. De-ionized (DI) water can vary in resistivity and all of the varying types of DI water can be used. IPA and other alcohols can be used for the inventive spin on glass synthesis and still serve the same purpose. Any multiple coat process can be applied to the inventive SOG with ease. It is to be understood, therefore, that this invention is not limited to the particular forms illustrated and that it is intended in the appended claims to cover all modifications that do not depart from the spirit and scope of this invention.

I claim:

1. A semiconductor device comprising:

a substrate material;

a plurality of device layers overlying the substrate material;

a layer of a spin on glass also overlying the substrate material, the spin on glass comprising:

on the order of 0% to 20% by volume of tetraethylorthosilicate (TEOS);

on the order of 0.01% to 20% by volume of tetraethylorthogermanate (TEOG);

on the order of 0% to 1% by volume the equivalent of nitric acid ($HNO_3$);

on the order of 70% to 85% by volume of alcohol; and a remaining balance of water, wherein the ratio of volume of water to the sum of volume of TEOS and TEOG is less than 0.80.

2. The semiconductor device of claim 1 wherein the 0% to 1% by volume of the equivalent of nitric acid ($HNO_3$), which comprises a portion of the spin on glass, is 70% nitric acid.

3. The semiconductor device of claim 1 wherein the 70% to 85% by volume of alcohol, which comprises a portion of the spin on glass, is isopropyl alcohol (IPA).

4. The semiconductor device of claim 1 wherein the substrate is a silicon substrate material and the volume percentage of TEOG in the spin on glass is fixed at a quantity which minimizes stress between the spin on glass and the silicon substrate material.

5. A semiconductor device comprising:
a substrate material;
a plurality of device layers overlying the substrate material;
a layer of a spin on glass also overlying the substrate material, the spin on glass comprising:
on the order of 10% by volume of tetraethylorthosilicate (TEOS);
on the order of 10% by volume of tetraethylorthogermanate (TEOG);
on the order of 0.5% by volume the equivalent of nitric acid ($HNO_3$);
on the order of 78% by volume of alcohol; and
a remaining balance of water.

6. The semiconductor device of claim 5 wherein the 0% to 1% by volume of the equivalent of nitric acid ($HNO_3$), which comprises a portion of the the spin on glass, is 70% nitric acid.

7. The semiconductor device of claim 5 wherein the 70% to 85% by volume of alcohol, which comprises a portion of the spin on glass, is isopropyl alcohol (IPA).

8. The semiconductor device of claim 1 wherein the ratio of volume of water to the sum of volume of TEOS and TEOG is substantially equal to 0.08.

9. The semiconductor device of claim 1 wherein the ratio of volume of nitric acid to volume of water is greater than 0.05.

10. The semiconductor device of claim 9 wherein the ratio of volume of nitric acid to volume of water is substantially equal to 1.0.

11. The semiconductor device of claim 1 wherein the ratio of volume of alcohol to the sum of volume of TEOS and TEOG is between 20.0 and 1.75.

12. The semiconductor device of claim 11 wherein the ratio of volume of isopropyl alcohol to the sum of volume of TEOS and TEOG is substantially equal to 3.7.

13. The semiconductor device of claim 5 wherein the ratio of volume of water to the sum of volume of TEOS and TEOG is less than 0.80.

14. A semiconductor device comprising:
a substrate material;
a plurality of device layers overlying the substrate material;
a layer of a spin on glass also overlying the substrate material, the spin on glass comprising:
0% to 20% by volume of tetraethylorthosilicate (TEOS);
0.01% to 20% by volume of tetraethylorthogermanate (TEOG);
0% to 1% by volume of nitric acid ($HNO_3$); and
a remaining balance of water and alcohol;
wherein the ratio of volume of water to the sum of volume of TEOS and TEOG is less than 0.80, the ratio of volume of nitric acid to volume of water is greater than 0.05, and the ratio of volume of alcohol to the sum of volume of TEOS and TEOG is less than 20.0 and greater than 1.75.

15. The semiconductor device of claim 14 wherein nitric acid, which comprises a portion of the spin on glass, is 70% nitric acid.

16. The semiconductor device of claim 14 wherein the alcohol, which comprises a portion of the spin on glass, is isopropyl alcohol (IPA).

17. The semiconductor device of claim 14 wherein the volume quantity of TEOS in the spin on glass is substantially equal to the volume quantity of TEOG in the spin on glass.

18. The semiconductor device of claim 14 wherein the TEOG is on the order of 0.01% to 20% by volume of tetraethylorthogermanate (TEOG) in the spin on glass.

19. The semiconductor device of claim 14 further comprising:
a trench region formed within the substrate wherein the spin on glass fills a portion of the trench region.

20. The semiconductor device of claim 19 wherein the trench region separates a first transistor and a second transistor wherein the first and second transistors are formed within the substrate.

* * * * *